(12) United States Patent
Tung

(10) Patent No.: US 11,921,344 B2
(45) Date of Patent: Mar. 5, 2024

(54) LASER MODULE

(71) Applicant: LECC TECHNOLOGY CO., LTD., Taoyuan (TW)

(72) Inventor: Hsin-Chih Tung, Kinmen County (TW)

(73) Assignee: LECC TECHNOLOGY CO., LTD., Taoyuan (TW)

( * ) Notice: Subject to any disclaimer, the term of this patent is extended or adjusted under 35 U.S.C. 154(b) by 296 days.

(21) Appl. No.: 17/576,049

(22) Filed: Jan. 14, 2022

(65) Prior Publication Data

US 2022/0137321 A1 May 5, 2022

Related U.S. Application Data

(63) Continuation-in-part of application No. 16/923,188, filed on Jul. 8, 2020, now abandoned.

(30) Foreign Application Priority Data

Jan. 20, 2020 (TW) .................................. 109200859

(51) Int. Cl.
*G01M 11/02* (2006.01)
*G02B 7/04* (2021.01)
*G02B 19/00* (2006.01)
*H01S 5/02325* (2021.01)
*H01S 5/024* (2006.01)

(52) U.S. Cl.
CPC ............ *G02B 7/04* (2013.01); *G01M 11/0228* (2013.01); *G02B 19/0009* (2013.01); *G02B 19/0052* (2013.01); *H01S 5/02325* (2021.01); *H01S 5/02415* (2013.01)

(58) Field of Classification Search
CPC .......... G01M 11/0228; G02B 19/0009; G02B 19/0052; G02B 7/04; G02B 7/102
USPC .................................. 356/138, 123, 609–630
See application file for complete search history.

(56) References Cited

U.S. PATENT DOCUMENTS

| 5,162,661 A * | 11/1992 | Sato ................... G11B 11/10576 356/624 |
| 5,521,394 A * | 5/1996 | Nakanishi ................. G01D 5/26 250/559.22 |
| 6,590,670 B1 * | 7/2003 | Kato .................... G01B 11/0608 356/609 |
| 2003/0123342 A1 * | 7/2003 | Ikai ...................... G11B 7/0946 369/44.14 |

(Continued)

*Primary Examiner* — Isiaka O Akanbi
(74) *Attorney, Agent, or Firm* — Li & Cai Intellectual Property (USA) Office

(57) ABSTRACT

A laser module is provided and includes a laser unit, a focusing lens, an electric device, and a temperature control device. The laser unit is configured to emit a laser light. The focusing lens corresponds in position to the laser unit, and the focusing lens is configured to converge the laser light emitted from the laser unit so as to outwardly output the laser light. The electric device includes a focusing ring, a voice coil motor, and a motor base. The voice coil motor is configured to drive and move the focusing lens in a straight line toward or away from the laser unit with the focusing ring. The temperature control device is mounted on the laser unit and includes a thermoelectric cooling module and a thermistor. The thermoelectric cooling module is configured to cooperate with the thermistor to adjust a working temperature of the laser unit.

10 Claims, 8 Drawing Sheets

(56) References Cited

U.S. PATENT DOCUMENTS

| | | | |
|---|---|---|---|
| 2004/0080759 A1* | 4/2004 | Shaver | G02B 21/0028 |
| | | | 356/609 |
| 2004/0174614 A1* | 9/2004 | Hovanky | G03B 3/10 |
| | | | 359/694 |
| 2011/0098926 A1* | 4/2011 | Hwang | G01Q 70/04 |
| | | | 701/300 |
| 2021/0088748 A1* | 3/2021 | Otsuka | G02B 15/145 |

* cited by examiner

LASER MODULE

CROSS-REFERENCE TO RELATED PATENT APPLICATION

This U.S. Non-provisional application for patent is a continuation-in-part application of patent application Ser. No. 16/923,188 filed on Jul. 8, 2020, which claims the priority of Taiwan patent application serial no. 109200859, filed on Jan. 20, 2020, and is now issued (as patent number TWM593917U). The entirety of each of the above-mentioned patent applications is hereby incorporated by reference herein and made as a part of this specification.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a laser module, and more particularly to an electric-zooming laser module.

BACKGROUND OF THE DISCLOSURE

Most conventional laser modules include a laser unit and a focusing lens, and the laser unit is configured to be electrically connected to a circuit board that is configured to actuate the laser unit to emit laser light. The focusing lens is disposed in front of the laser unit, and a central axis of the focusing lens and a central axis of the laser unit are coaxially aligned. The focusing lens is configured to converge the laser light emitted from the laser unit so as to outwardly output the laser light. However, a focal length of the focusing lens of the conventional laser modules can only be adjusted by mechanical means. Accordingly, the conventional laser module is inconvenient to operate, and users may have difficulties in adjusting the focal length of the focusing lens once the laser module has been shipped.

SUMMARY OF THE DISCLOSURE

In response to the above-referenced technical inadequacies, the present disclosure provides a laser module that is configured to adjust a focal length of a focusing lens by electric means. The laser module is convenient for users to operate, and the focal length of the focusing lens can be adjusted as needed.

In one aspect, the present disclosure provides a laser module, and the laser module includes a laser unit, a focusing lens, an electric device, and a temperature control device. The laser unit is configured to emit a laser light, and the focusing lens corresponds in position to the laser unit. The focusing lens is configured to converge the laser light emitted from the laser unit so as to outwardly output the laser light. The electric device includes a focusing ring, a voice coil motor, and a motor base, the voice coil motor is electrically connected to the focusing ring, and the motor base accommodates the focusing ring and the voice coil motor. The focusing ring is mounted on the focusing lens, and the focusing lens is accommodated in the motor base. The voice coil motor is configured to drive and move the focusing lens in a straight line toward or away from the laser unit with the focusing ring, so as to adjust a focal length of the focusing lens. The temperature control device is mounted on the laser unit and includes a thermoelectric cooling module and a thermistor, and the thermistor is electrically connected to the thermoelectric cooling module. The thermistor is configured to detect a working temperature of the laser unit, and the thermoelectric cooling module is configured to cooperate with the thermistor to adjust the working temperature of the laser unit, so that an error of the working temperature of the laser unit is within ±1° C.

In certain embodiments, a use temperature of the thermoelectric cooling module is not more than 110° C., a temperature difference during use of the thermoelectric cooling module is between 70° C. and 90° C., and a power of the thermoelectric cooling module is between 1.6 Wh and 5 Wh.

In certain embodiments, the laser module further includes a laser fixing member that is configured to accommodate the laser unit, and the laser fixing member is mounted on the motor base. The thermistor is mounted on the laser fixing member and is near the laser unit, and the thermistor is disposed spaced apart from the thermoelectric cooling module.

In certain embodiments, the thermoelectric cooling module has a heat absorption surface and a heat dissipation surface on opposite sides, and the heat absorption surface is disposed on the laser fixing member.

In certain embodiments, the laser module further includes a heat dissipation device including a fixed housing, a heat dissipation ring, and a heat dissipation tube. The heat dissipation ring is disposed in the fixed housing, and the heat dissipation tube is partially disposed in the heat dissipation ring. The heat dissipation surface of the thermoelectric cooling module is arranged in the heat dissipation ring, and a part of the laser unit is arranged in the heat dissipation ring.

In certain embodiments, the laser module further includes a pin connector that is electrically connected to the laser unit and is mounted in the fixed housing, in which the end of the fixed housing is relatively far away from the thermoelectric cooling module.

In certain embodiments, the laser module further includes a reflecting mirror group that is mounted on the electric device, and the reflecting mirror group includes a first housing, a mirror holder, and a light sensor. The mirror holder is disposed in the first housing, the light sensor disposed in the mirror holder, a part of the focusing ring and a part of the focusing lens are arranged in the mirror holder, and the light sensor corresponds in position to the focusing lens.

In certain embodiments, the laser module further includes a prism group that is mounted on the reflecting mirror group, and the prism group includes a second housing, a fixing piece, and a Powell Lenses. The fixing piece is disposed in the second housing, and the Powell Lenses is mounted on the fixing piece. A tip of the Powell Lenses corresponds in position to the light sensor, the second housing is locked to the first housing, and the fixing piece is disposed on an end of the second housing. The end of the second housing is relatively far away from an end of the first housing.

In another aspect, the present disclosure provides a laser module, and the laser module includes a laser unit, a focusing lens, an electric device, and a temperature control device. The laser unit is configured to emit a laser light, and the focusing lens corresponds in position to the laser unit. The focusing lens is configured to converge the laser light emitted from the laser unit so as to outwardly output the laser light. The electric device includes a focusing ring, a voice coil motor, and a motor base, the voice coil motor is electrically connected to the focusing ring, and the motor base accommodates the focusing ring and the voice coil motor. The focusing ring is mounted on the focusing lens, and the focusing lens is accommodated in the motor base. The voice coil motor is configured to drive and move the focusing lens in a straight line toward or away from the laser unit with the focusing ring, so as to adjust a focal length of the focusing lens. The temperature control device is mounted on the laser unit and includes a thermoelectric cooling module and a thermistor, and the thermistor is electrically connected to the thermoelectric cooling module. The thermistor is configured to detect a working temperature of the laser unit, and the thermoelectric cooling module is configured to cooperate with the thermistor to adjust the working temperature of the laser unit, so that an error of the working temperature of the laser unit is within ±1° C. The focusing lens is arranged between the detecting device and the laser unit, and the detecting device, the focusing lens, and the laser unit are located along a same straight line. When the laser light emitted from the laser unit is converged through the focusing lens, the laser light is outputted from the focusing lens and travels onto the detecting device for detection of the focal length of the focusing lens.

In certain embodiments, a use temperature of the thermoelectric cooling module is not more than 110° C., a temperature difference during use of the thermoelectric cooling module is between 70° C. and 90° C., and a power of the thermoelectric cooling module is between 1.6 Wh and 5 Wh.

Therefore, in the laser module provided by the present disclosure, by virtue of "the voice coil motor being configured to drive and move the focusing lens in a straight line toward or away from the laser unit with the focusing ring, so as to adjust a focal length of the focusing lens" and "the thermoelectric cooling module being configured to cooperate with the thermistor to adjust the working temperature of the laser unit, so that an error of the working temperature of the laser unit being within ±1° C.," the laser module of the present disclosure is configured to adjust the focal length of the focusing lens by electric means. The laser module is convenient to operate, and users can adjust (or slightly adjust) the focal length of the focusing lens as needed once the laser module has been shipped.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
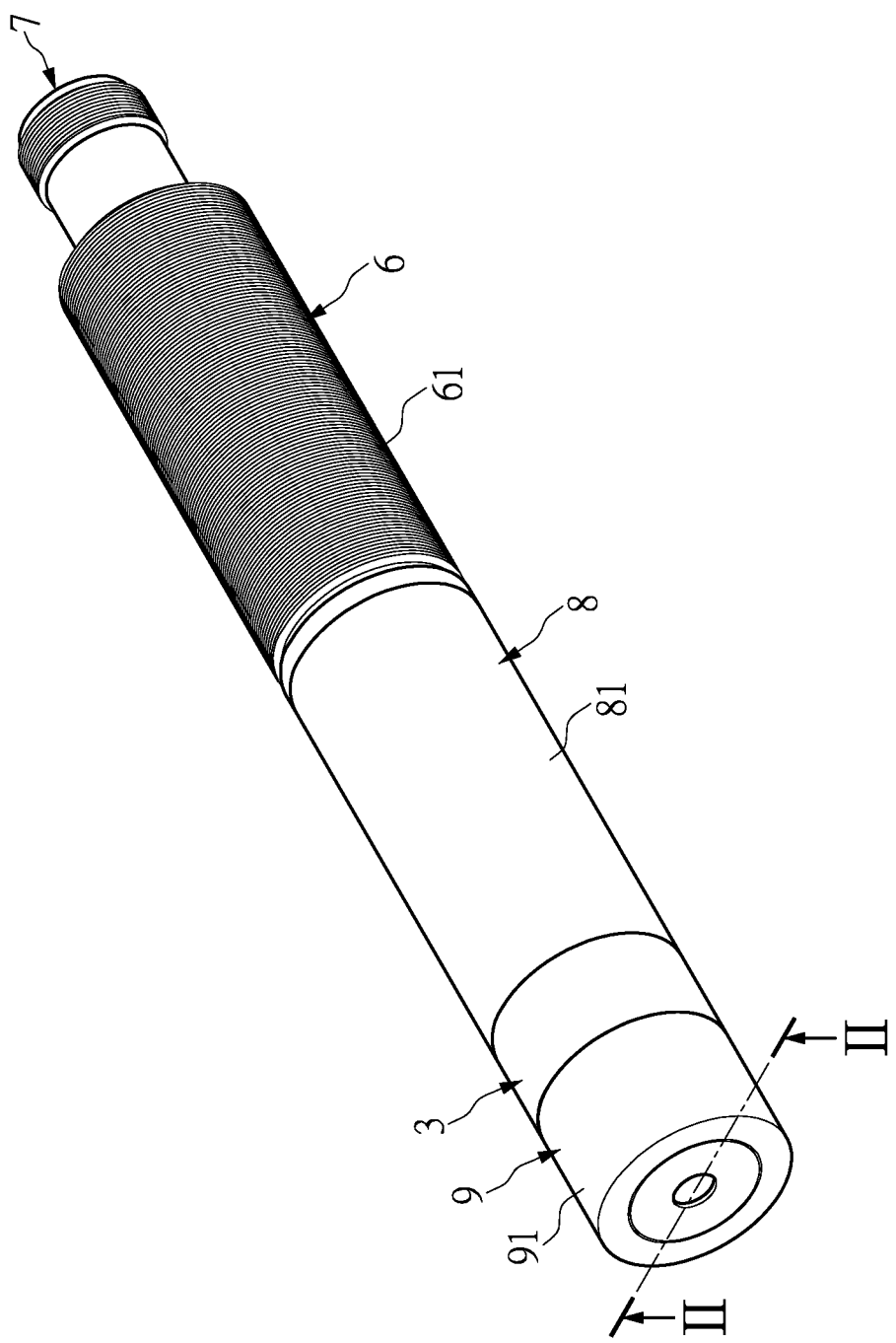
FIG. 1 is a perspective view of a laser module according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 8, an embodiment of the present disclosure provides a laser module 100, and the laser module 100 includes a laser unit 1, a focusing lens 2, an electric device 3, a temperature control device 4, a laser fixing member 5, a heat dissipation device 6, a pin connector 7, a reflecting mirror group 8, a prism group 9, and a detecting device 10, but the present disclosure is not limited thereto. For instance, in other embodiments not shown in the present disclosure, the laser module 100 can also not include the fixing member 5, the heat dissipation device 6, the pin connector 7, the reflecting mirror group 8, the prism group 9, and the detecting device 10.

It should be noted that in the present embodiment, the laser unit 1, the focusing lens 2, the electric device 3, and the temperature control device 4 of the laser module 100 are described in conjunction with the fixing member 5, the heat dissipation device 6, the pin connector 7, the reflecting mirror group 8, the prism group 9, and the detecting device 10 of the laser module 100. However, in other embodiments not shown in the present disclosure, the laser unit 1, the focusing lens 2, the electric device 3, and the temperature control device 4 of the laser module 100, or the laser unit 1, the focusing lens 2, the electric device 3, the temperature control device 4, and the detecting device 10 of the laser module 100, can also be used together (e.g., sold) or used in cooperation with other components.

Figure 2:
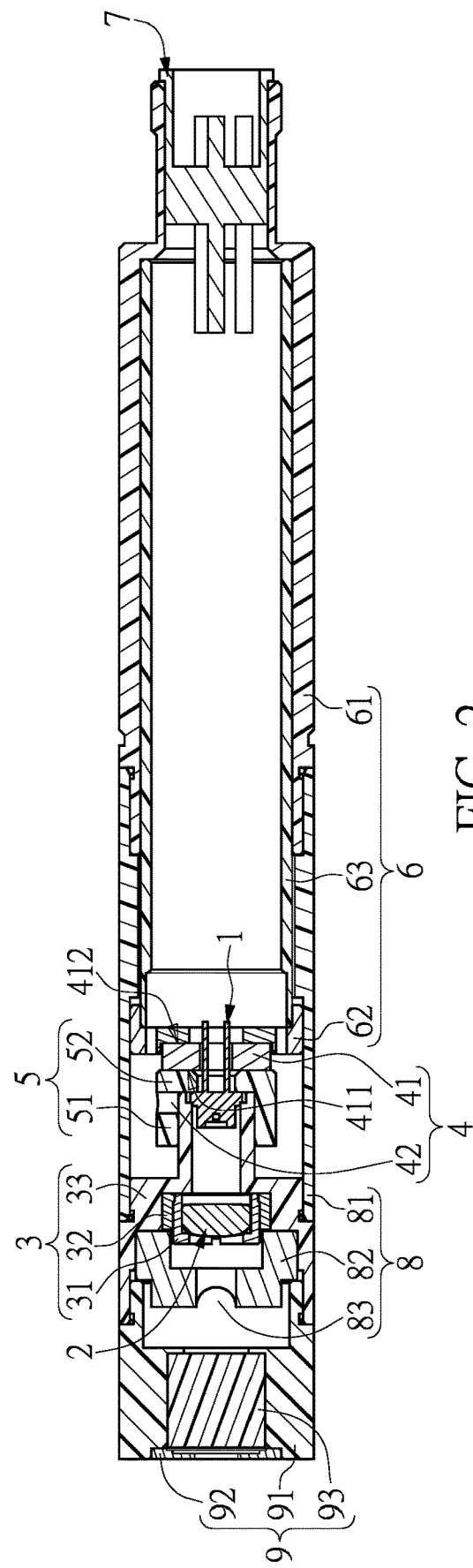
FIG. 2 is a cross-sectional view taken along line II-II of FIG. 1.
Figure 3:
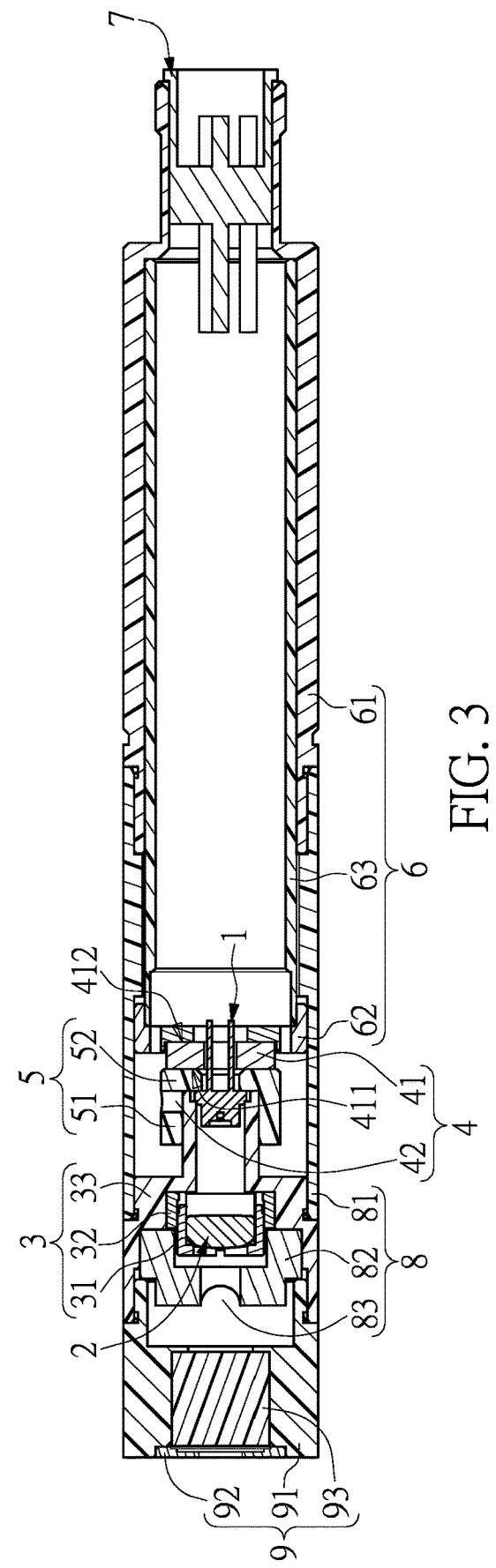
FIG. 3 is another cross-sectional view taken along line II-II of FIG. 1.

As shown in FIG. 2 to FIG. 3, the laser unit 1 is configured to emit a laser light (not shown), and the laser unit 1 is a laser light source including laser diodes. The laser unit 1 is electrically connected to a circuit unit (not shown) so that the laser unit 1 can be actuated by the circuit unit to emit laser light.

The focusing lens 2 corresponds in position to the laser unit 1, and the focusing lens 2 is disposed in front of the laser unit 1. The focusing lens 2 and the laser unit 1 are located along the same straight direction, that is, a central axis of the focusing lens 2 and a central axis of the laser unit 1 are the same straight line. The focusing lens 2 is configured to converge the laser light emitted from the laser unit 1 so as to outwardly output the laser light. Since the structure of the laser unit 1 and the focusing lens 2 are well known in the art, and will not be reiterated herein. However, the present disclosure is not limited thereto.

As shown in FIG. 2 to FIG. 3, the electric device 3 includes a focusing ring 31, a voice coil motor 32 electrically connected to the focusing ring 31, and a motor base 33 accommodating the focusing ring 31 and the voice coil motor 32, but the present disclosure is not limited thereto. For instance, in other embodiments not shown in the present disclosure, the voice coil motor 32 can also be replaced with a linear motor.

The focusing ring 31 is mounted on the focusing lens 2, and the focusing lens 2 is accommodated in the motor base 33. The motor base 33 is stationary relative to the laser unit 1, and the focusing lens 2 is moved in the motor base 33 through the voice coil motor 32 and the focusing ring 31.

It should be noted that the voice coil motor 32 is configured to drive and move the focusing lens 2 in a straight line toward or away from the laser unit 1 with the focusing ring 31, so as to adjust a focal length of the focusing lens 2. The voice coil motor 32 has advantages of having a smaller size and taking up less space, and the voice coil motor 32 is configured to be actuated by changing a current, a voltage, or a polarity of the voice coil motor 32 so as to drive and straightly move the focusing lens 2 toward or away from the laser unit 1.

For instance, when a greater DC current is provided to the voice coil motor 32, the electric device 3 drives and straightly moves the focusing lens 2 toward the laser unit 1, and when a less DC current is provided to the voice coil motor 32, the electric device 3 drives and straightly moves the focusing lens 2 away from the laser unit 1. Accordingly, the focusing lens 2 is arranged on the pre-determined location and completes a function of focusing the focal point of the focusing lens 2.

In another embodiment of the present disclosure, the electric device 3 is configured to be actuated by changing the polarity of the electric device 3. For example, when the DC current is provided to a positive polarity of the electric device 3, and the electric device 3 drives and straightly moves the focusing lens 2 toward the laser unit 1. When the DC current is provided to a negative polarity of the electric device 3, the electric device 3 drives and straightly moves the focusing lens 2 away from the laser unit 1. When the greater DC current is provided to the electric device 3, the electric device 3 moves the focusing lens 2 by a greater distance, and when the less DC current is provided to the electric device 3, the electric device 3 moves the focusing lens 2 by a less distance. Accordingly, the electric device 3 can easily tweak the focal point of the focusing lens 2 by digital control.

In another embodiment of the present disclosure, the focusing lens 2 and the electric device 3 can have a guiding mechanism (not shown) therebetween. The guiding mechanism is configured to guide the focusing lens 2 to stably move in the straight line. The guiding mechanism includes convex ribs and grooves, but the structure of the guiding mechanism is not limited thereto.

Figure 5:
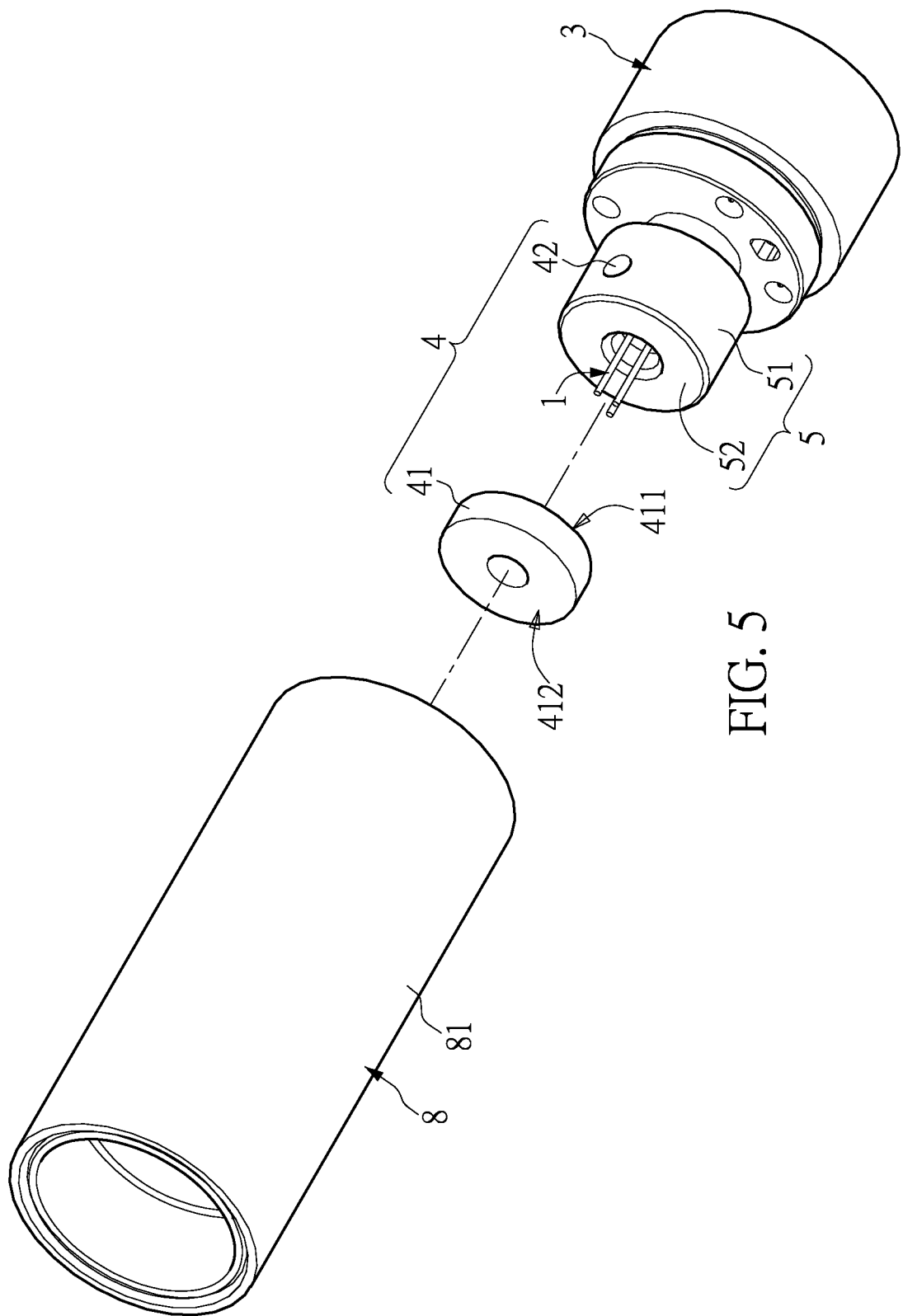
FIG. 5 is an exploded view of a temperature control device with an electric device and a reflecting mirror group according to the embodiment of the present disclosure.

As shown in FIG. 2, FIG. 3, and FIG. 5, the temperature control device 4 is mounted on the laser unit 1 and includes a thermoelectric cooling module 41 and a thermistor 42 that is electrically connected to the thermoelectric cooling module 41. The thermoelectric cooling module 41 has a heat absorption surface 411 and a heat dissipation surface 412 on opposite sides, and the heat absorption surface 411 is disposed on the laser fixing member 5.

Specifically speaking, the thermistor 42 is configured to detect a working temperature of the laser unit 1, and the thermoelectric cooling module 41 is configured to cooperate with the thermistor 42 to adjust the working temperature of the laser unit 1, so that an error of the working temperature of the laser unit 1 is within ±1° C.

It should be noted that when the laser unit 1 emits the laser light, if the working temperature of the laser unit 1 rises by 1° C., a wavelength of the laser light increases 0.2 mm accordingly. That is, assuming that the working temperature of the laser unit 1 is 25° C. and the wavelength of the laser light is 660 nm accordingly, when the working temperature of the laser unit 1 rises by 1° C., the wavelength of the laser light rises to 660.2 nm.

Accordingly, if the working temperature of the laser unit 1 rises too much, the wavelength of the laser light will be too far away from its initial value, and the laser module 100 will be prone to error when the laser module 100 measures.

Thus, when the thermistor 42 detects that the working temperature of the laser unit 1 has risen too much, the thermoelectric cooling module 41 can dissipate a heat of the laser unit 1 and control the error of the working temperature of the laser unit 1 to be within ±1° C., so as to prevent the measurement of the laser module 100 from being prone to error.

It should be noted that a use temperature of the thermoelectric cooling module 41 is not more than 110° C., a temperature difference during use of the thermoelectric cooling module 41 is between 70° C. and 90° C., and a power of the thermoelectric cooling module 41 is between 1.6 Wh and 5 Wh, but the present disclosure is not limited thereto. For instance, in other embodiments of the present disclosure, the use temperature of the thermoelectric cooling module 41, the temperature difference during use of the thermoelectric cooling module 41, and the power of the thermoelectric cooling module 41 can be adjusted according to practical requirements.

As shown in FIG. 2, FIG. 3, and FIG. 5, the laser fixing member 5 is configured to accommodate the laser unit 1, and the laser fixing member 5 is mounted on the motor base 33. The thermistor 42 is mounted on the laser fixing member 5 and is near the laser unit 1, and the thermistor 42 is disposed spaced apart from the thermoelectric cooling module 41.

More specifically, in the present embodiment, as shown in FIG. 2, FIG. 3, and FIG. 5, the laser fixing member 5 has a surrounding portion 51 and a bottom portion 52 connected to the surrounding portion 51. The laser unit 1 is mounted in a space formed around by the surrounding portion 51, and the laser unit 1 passes through the bottom portion 52. The thermistor 42 is mounted on the surrounding portion 51 and is near to a part of the laser unit 1 that emits the laser light. The bottom portion 52 is disposed between the thermistor 42 and the thermoelectric cooling module 41, and the heat absorption surface 411 of the thermoelectric cooling module 41 is disposed on the bottom portion 52.

As shown in FIG. 2 to FIG. 4, and FIG. 7, the heat dissipation device 6 includes a fixed housing 61, a heat dissipation ring 62 disposed in the fixed housing 61, and a heat dissipation tube 63 partially disposed in the heat dissipation ring 62. The heat dissipation surface 412 of the thermoelectric cooling module 41 is arranged in the heat dissipation ring 62, and a part of the laser unit 1 is arranged in the heat dissipation ring 62.

In the present embodiment, the fixed housing 61 is made of a plastic steel, the fixed housing 61 is preferably a pipe body, and a diameter of the fixed housing 61 is 18 mm and a length of the fixed housing 61 is 42 mm, but the present disclosure is not limited thereto. For instance, in other embodiments in the present disclosure, the fixed housing 61 cannot be a tube body.

Furthermore, in the present embodiment, the heat dissipation ring 62 and the heat dissipation tube 63 are preferably made of a copper, but the present disclosure is not limited thereto. For instance, in other embodiments of the present disclosure, the heat dissipation ring 62 and the heat dissipation tube 63 can also be made of other metals with better heat dissipation properties.

Figure 7:
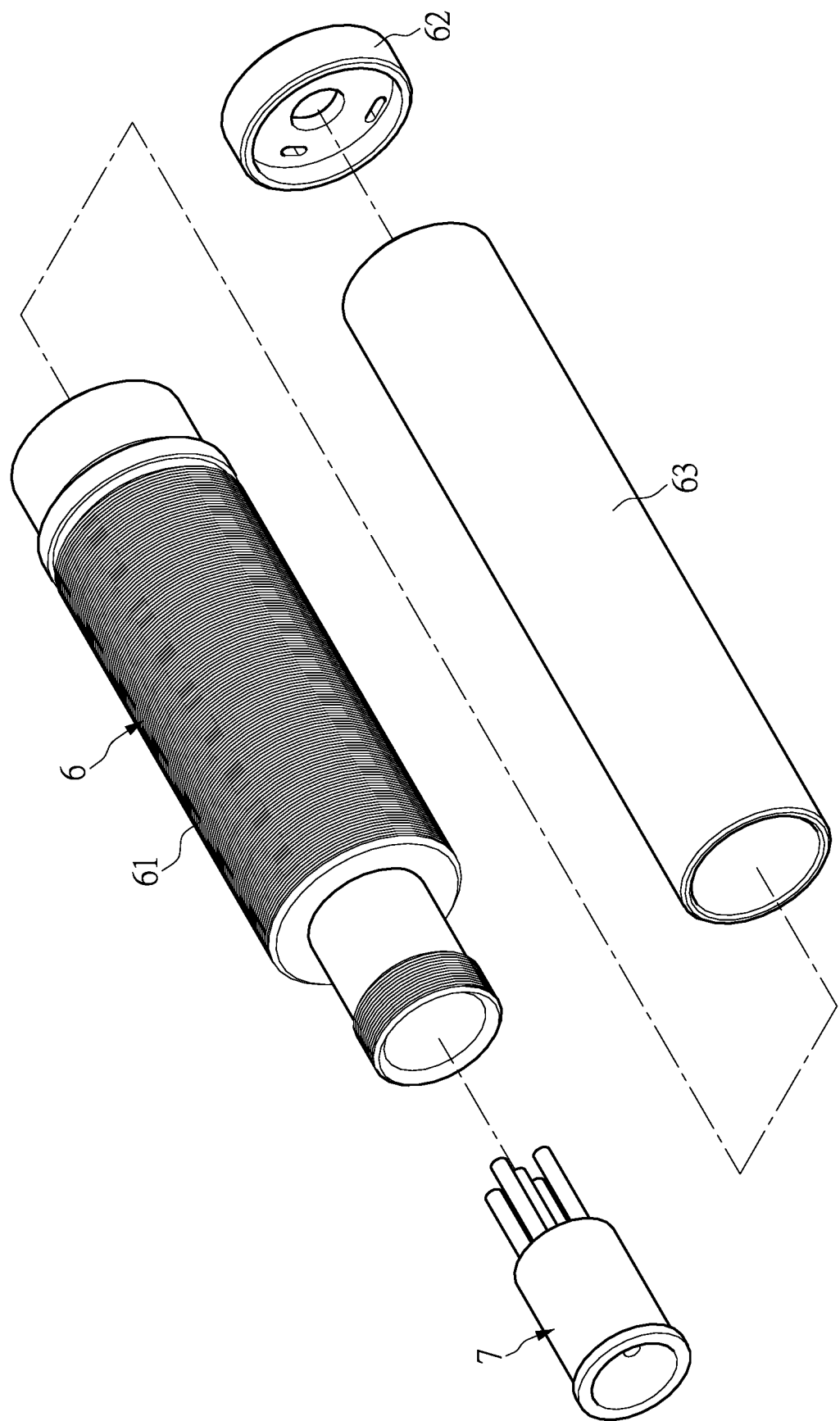
FIG. 7 is an exploded view of a heat dissipation device with a pin connector according to the embodiment of the present disclosure.

As shown in FIG. 2, FIG. 3, and FIG. 7, the pin connector 7 is electrically connected to the laser unit 1 and is mounted in the fixed housing 61, and the end of the fixed housing 61 is relatively far away from the thermoelectric cooling module 41. Since the pin connector 7 is well known in the art, and will not be reiterated herein. However, the present disclosure is not limited thereto.

Figure 4:
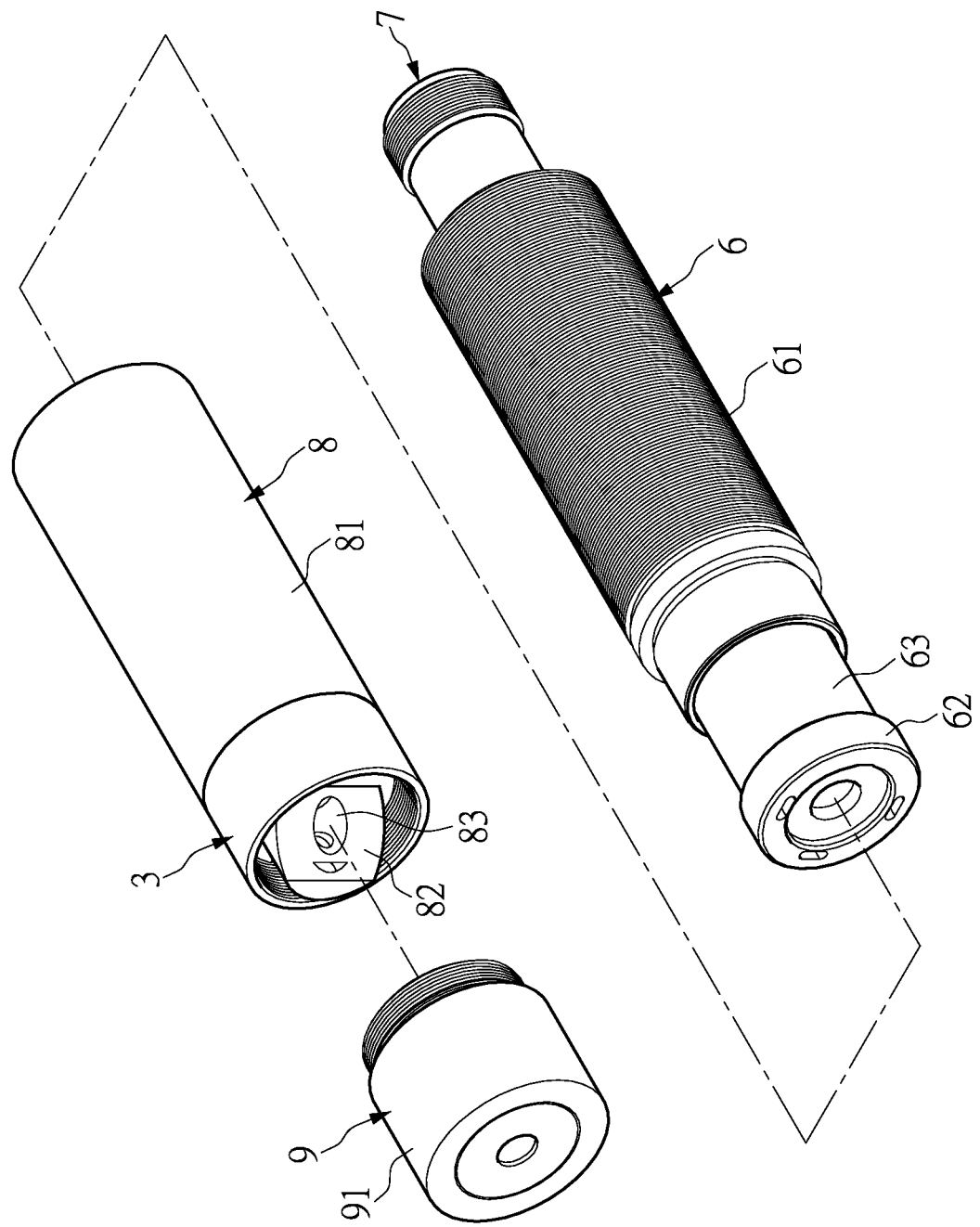
FIG. 4 is an exploded view of the laser module according to the embodiment of the present disclosure.

As shown in FIG. 2 to FIG. 4, the reflecting mirror group 8 is mounted on the electric device 3, and the reflecting mirror group 8 includes a first housing 81, a mirror holder 82 disposed in the first housing 81, and a light sensor 83 disposed in the mirror holder 82. A part of the focusing ring 31 and a part of the focusing lens 2 are arranged in the mirror holder 82, and the light sensor 83 corresponds in position to the focusing lens 2.

Figure 6:
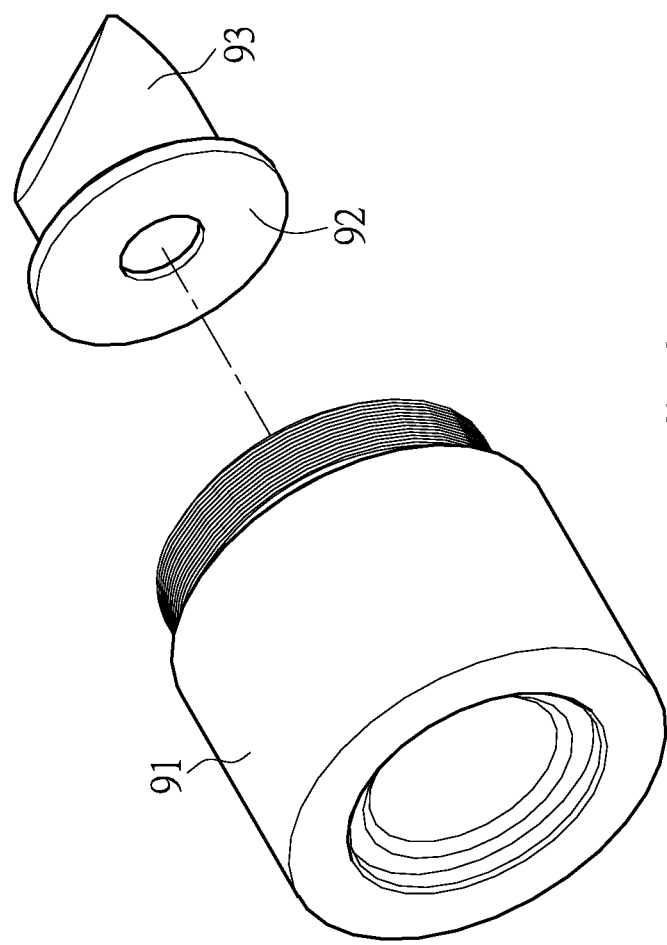
FIG. 6 is an exploded view of a prism group according to the embodiment of the present disclosure.

As shown in FIG. 2, FIG. 3, and FIG. 6, the prism group 9 is mounted on the reflecting mirror group 8, and the prism group 9 includes a second housing 91, a fixing piece 92 disposed in the second housing 91, and a Powell Lenses 93 mounted on the fixing piece 92. The second housing 91 is in a tube shape, and the fixing piece 92 is in a circular shape. Furthermore, a diameter of the second housing 91 is 18 mm, a length of the second housing 91 is 16.5 mm, a diameter of the fixing piece 92 is 18 mm, and a thickness of the fixing piece 92 is 1 mm, but the present disclosure is not limited thereto.

More specifically, a tip of the Powell Lenses 93 corresponds in position to the light sensor 83, the second housing 91 is locked to the first housing 81. The fixing piece 92 is disposed on an end of the second housing 91, and the end of the second housing 91 is relatively far away from an end of the first housing 81. Since the structure of the Powell Lenses 93 is well known in the art, and will not be reiterated herein.

Figure 8:
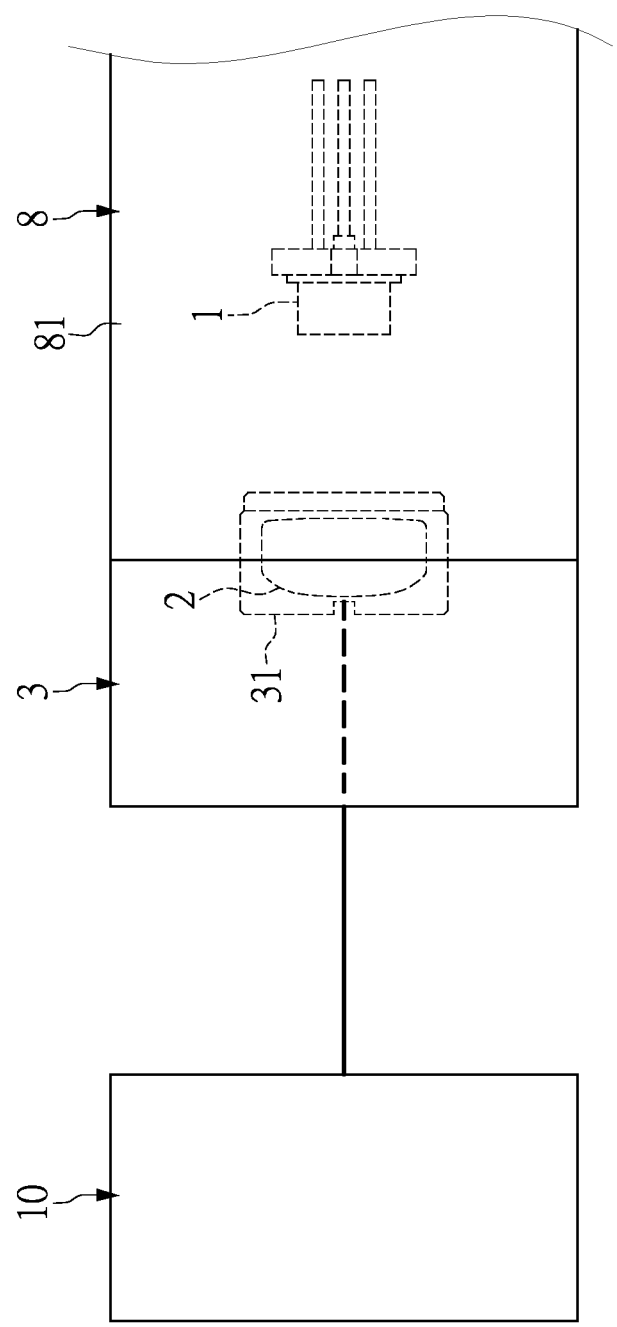
FIG. 8 is a schematic view of a detecting device corresponding in position to a focusing lens according to the embodiment of the present disclosure.

As shown in FIG. 8, the focusing lens 2 is arranged between the detecting device 10 and the laser unit 1, and the detecting device 10, the focusing lens 2, and the laser unit 1 are located along a same straight line. The focusing lens 2 is configured to converge the laser light emitted from the laser unit 1 so as to outwardly output the laser light on the detecting device 10. When the electric device 3 drives and moves the focusing lens 2 in the straight line toward or away from the laser unit 1 so as to adjust the focal length of the focusing lens 2, the detecting device 7 detects the focal length of the focusing lens 2 until an adjustment of the focal length of the focusing lens 2 is complete, and the electric device 3 will then stop moving the focusing lens 2. Accordingly, the focusing lens 2 is positioned at a fixed position.

Beneficial Effects of the Embodiments

In conclusion, in the laser module 100 provided by the present disclosure, by virtue of "the voice coil motor 32 being configured to drive and move the focusing lens 2 in a straight line toward or away from the laser unit 1 with the focusing ring 31, so as to adjust a focal length of the focusing lens 2" and "the thermoelectric cooling module 41 being configured to cooperate with the thermistor 42 to adjust the working temperature of the laser unit 1, so that an error of the working temperature of the laser unit 1 being within ±1° C.," the laser module 100 of the present disclosure is configured to adjust the focal length of the focusing lens 2 by electric means. The laser module 100 is convenient to operate, and users can adjust (or slightly adjust) the focal length of the focusing lens 2 as needed once the laser module 100 has been shipped.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A laser module, comprising:
   a laser unit being configured to emit a laser light;
   a focusing lens corresponding in position to the laser unit, wherein the focusing lens is configured to converge the laser light emitted from the laser unit so as to outwardly output the laser light;
   an electric device including a focusing ring, a voice coil motor electrically connected to the focusing ring, and a motor base accommodating the focusing ring and the voice coil motor, wherein the focusing ring is mounted on the focusing lens, and the focusing lens is accommodated in the motor base, and wherein the voice coil motor is configured to drive and move the focusing lens in a straight line toward or away from the laser unit with the focusing ring, so as to adjust a focal length of the focusing lens; and
   a temperature control device mounted on the laser unit and including a thermoelectric cooling module and a thermistor electrically connected to the thermoelectric cooling module, wherein the thermistor is configured to detect a working temperature of the laser unit, and the thermoelectric cooling module is configured to cooperate with the thermistor to adjust the working temperature of the laser unit, so that an error of the working temperature of the laser unit is within ±1° C.

2. The laser module according to claim 1, wherein a use temperature of the thermoelectric cooling module is not more than 110° C., a temperature difference during use of the thermoelectric cooling module is between 70° C. and 90° C., and a power of the thermoelectric cooling module is between 1.6 Wh and 5 Wh.

3. The laser module according to claim 1, further comprising a laser fixing member configured to accommodate the laser unit, wherein the laser fixing member is mounted on the motor base, and the thermistor is mounted on the laser fixing member and is near the laser unit, and wherein the thermistor is disposed spaced apart from the thermoelectric cooling module.

4. The laser module according to claim 3, wherein the thermoelectric cooling module has a heat absorption surface and a heat dissipation surface on opposite sides, and the heat absorption surface is disposed on the laser fixing member.

5. The laser module according to claim 4, further comprising a heat dissipation device including a fixed housing, a heat dissipation ring disposed in the fixed housing, and a heat dissipation tube partially disposed in the heat dissipation ring, wherein the heat dissipation surface of the thermoelectric cooling module is arranged in the heat dissipation ring, and a part of the laser unit is arranged in the heat dissipation ring.

6. The laser module according to claim 5, further comprising a pin connector electrically connected to the laser unit and mounted in the fixed housing, wherein the end of the fixed housing is relatively far away from the thermoelectric cooling module.

7. The laser module according to claim 1, further comprising a reflecting mirror group mounted on the electric device, wherein the reflecting mirror group includes a first housing, a mirror holder disposed in the first housing, and a light sensor disposed in the mirror holder, a part of the focusing ring and a part of the focusing lens are arranged in the mirror holder, and the light sensor corresponds in position to the focusing lens.

8. The laser module according to claim 7, further comprising a prism group mounted on the reflecting mirror group, wherein the prism group includes a second housing, a fixing piece disposed in the second housing, and a Powell Lenses mounted on the fixing piece, wherein a tip of the Powell Lenses corresponds in position to the light sensor, the second housing is locked to the first housing, and the fixing piece is disposed on an end of the second housing, and wherein the end of the second housing is relatively far away from an end of the first housing.

9. A laser module, comprising:
a laser unit being configured to emit a laser light;
a focusing lens corresponding in position to the laser unit, wherein the focusing lens is configured to converge the laser light emitted from the laser unit so as to outwardly output the laser light;
an electric device including a focusing ring, a voice coil motor electrically connected to the focusing ring, and a motor base accommodating the focusing ring and the voice coil motor, wherein the focusing ring is mounted on the focusing lens, and the focusing lens is accommodated in the motor base, and wherein the voice coil motor is configured to drive and move the focusing lens in a straight line toward or away from the laser unit with the focusing ring, so as to adjust a focal length of the focusing lens;
a temperature control device mounted on the laser unit and including a thermoelectric cooling module and a thermistor electrically connected to the thermoelectric cooling module, wherein the thermistor is configured to detect a working temperature of the laser unit, and the thermoelectric cooling module is configured to cooperate with the thermistor to adjust the working temperature of the laser unit, so that an error of the working temperature of the laser unit is within ±1° C.; and
a detecting device, wherein the focusing lens is arranged between the detecting device and the laser unit, and the detecting device, the focusing lens, and the laser unit are located along a same straight line, and wherein, when the laser light emitted from the laser unit is converged through the focusing lens, the laser light is outputted from the focusing lens and travels onto the detecting device for detection of the focal length of the focusing lens.

10. The laser module according to claim 9, wherein a use temperature of the thermoelectric cooling module is not more than 110° C., a temperature difference during use of the thermoelectric cooling module is between 70° C. and 90° C., and a power of the thermoelectric cooling module is between 1.6 Wh and 5 Wh.

\* \* \* \* \*